United States Patent [19]

Lash et al.

[11] 4,444,607
[45] Apr. 24, 1984

[54] METHOD OF MAKING A SIGHT MODEL

[75] Inventors: Stephen Lash, Parma; Charles W. Roberts, Akron; Samuel P. Landers, Uniontown, all of Ohio

[73] Assignee: The Goodyear Tire & Rubber Company, Akron, Ohio

[21] Appl. No.: 362,011

[22] Filed: Mar. 25, 1982

[51] Int. Cl.$^3$ .................................................. B44C 3/00
[52] U.S. Cl. ........................................ 156/58; 156/59; 264/221; 264/225; 428/913; 430/160; 430/204; 434/152
[58] Field of Search ................... 156/58, 59; 264/221, 264/225; 428/913; 430/160, 204; 434/152

[56] References Cited

U.S. PATENT DOCUMENTS 3,901,705 8/1975 Pazos .............................. 156/58 X
4,001,062 1/1977 Iisaka et al. ...................... 156/59

FOREIGN PATENT DOCUMENTS 1243043 8/1971 United Kingdom .
2019605 10/1979 United Kingdom .
2035602 6/1980 United Kingdom .

*Primary Examiner*—Robert A. Dawson
*Attorney, Agent, or Firm*—Henry C. Young, Jr.

[57] ABSTRACT

This invention comprises a process for molding a three dimensional decorative article where cored out or raised portions extend to a depth of at least 0.6 centimeter, said process comprising generating electronically a line drawing of said article and electronically displaying the drawing; photographing said drawing to form a photographic transparency; positioning said transparency over a layer of a liquid photopolymer having a depth greater than 0.6 centimeter; exposing said photopolymer through said transparency to actinic light to set the photopolymer; and removing the liquid from the set photopolymer to form a three dimensional article having the appearance of said drawing.

2 Claims, 6 Drawing Figures

U.S. Patent
Apr. 24, 1984
4,444,607
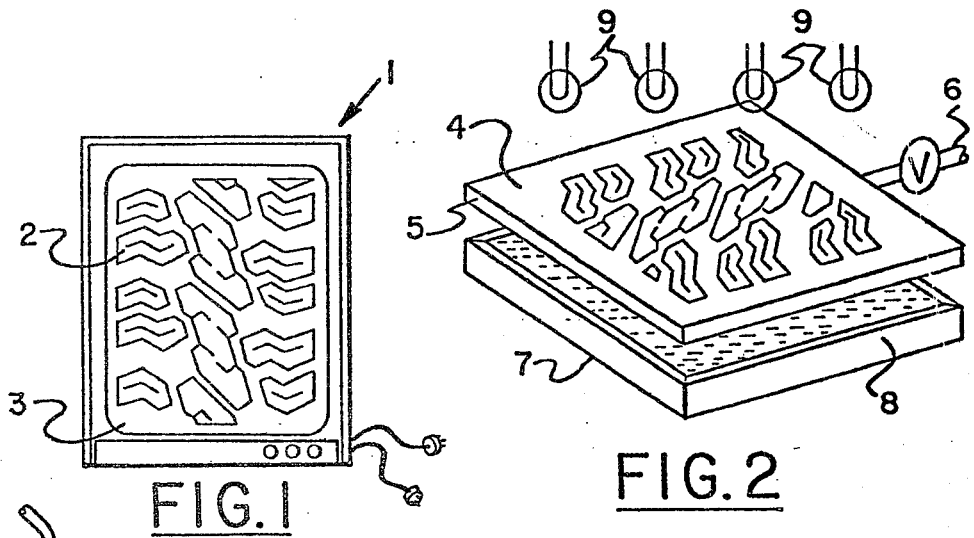
FIG. 1
FIG. 2
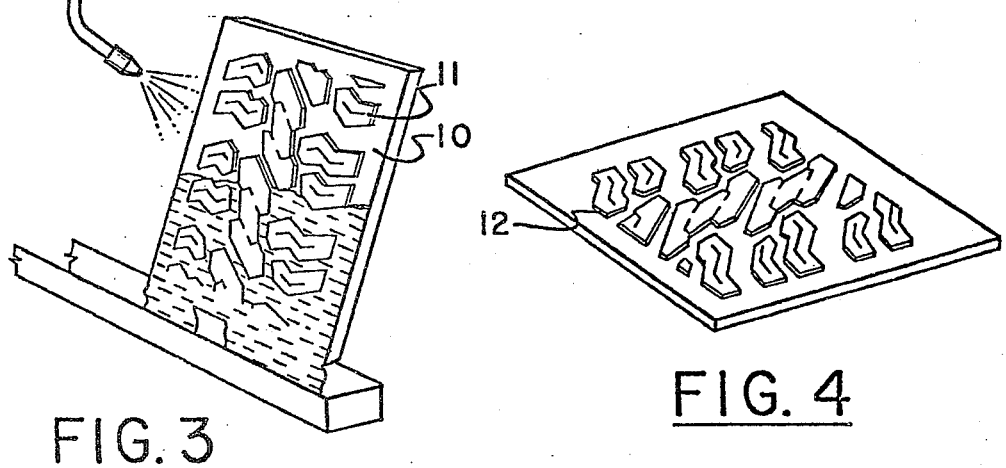
FIG. 3
FIG. 4
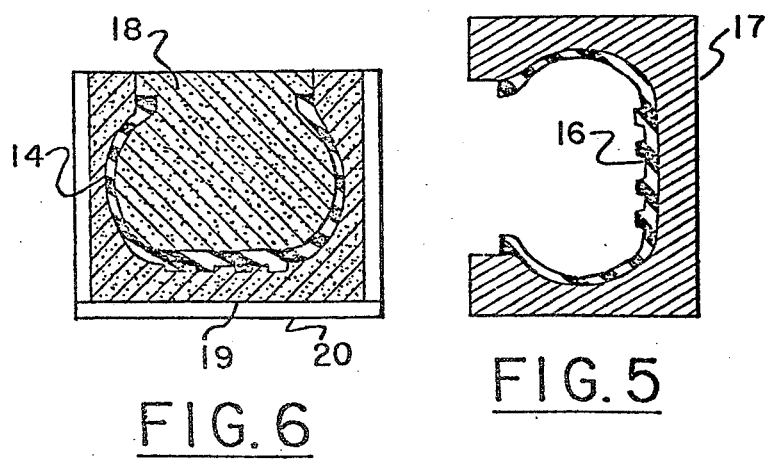
FIG. 6
FIG. 5

METHOD OF MAKING A SIGHT MODEL

TECHNICAL FIELD

This invention relates to an improved method of making sight models, said models and like carved items and the use of said models to demonstrate visually the appearance of an article in a three dimensional view or to make a mold to mold said article.

BACKGROUND ART

In many instances, three-dimensional models or mockups of high style articles are especially prepared and shown or sold to prospective purchasing agents or customers which are normally called sight models. Thus the prospective customer can view the design and aesthetic appearance of the article to be purchased, produced and delivered against the order.

In the particular case of a new tire design, or even a unitary shoe sole, the preparation of individual sight models can be quite expensive in labor and material charges, and can also require a considerable amount of time to develop and make the three-dimensional sight model because of manual labor in making the hand carvings.

DISCLOSURE AND PRACTICE OF THE INVENTION

In accordance with this invention, three dimensional sight models of articles can be produced by the steps of developing a design or line drawing of the desired article, especially by use of a conventional computer program for developing tire design, for instance, and displaying the design or line drawing electronically, viz cathode tube, photographing said display and developing the photograph to give the desired transparency, either positive or negative type, placing said transparency relative to a layer of liquid photopolymer having a depth greater than 0.6, preferably at least 0.8 centimeter where actinic light can pass through the transparency to contact said photopolymer, preferably from the top rather than the bottom, exposing said liquid photopolymer through said transparency to actinic light to set the exposed photopolymer and then removing the liquid from the set photopolymer to develop said sight model as a cured three-dimensional photopolymer having the appearance of said article. The sight model can be shown to the customer for approval, or if desired can be placed in a suitable support means to form a mold for molding the article in the normal medium used to manufacture said article. Thus the finished article is readily available for testing and approval by the customer in a very short time, frequently in a few hours instead of weeks by prior art methods. When the article is a new design for a tire, and specifically a new tread pattern, the computer can be programmed in the conventional and well-known manner to develop the parameters that give the desired noise level and skid resistance on dry, wet or iced surface, and then be instructed to draw a design on an electronically generated display, such as, for example, a cathode ray tube in a manner well-known and utilized daily in the tire design art. On one hand, for instance, the design could be that for a shoe sole of the unitary type, to mention one of the many uses.

The transparency is made by well-known photography techniques with a camera and film. The electronic display of the design is shot and the film developed at the desired enlargement for the sight model wanted or, in the case of a tire, the size to be made. The transparency preferably is positioned on a holder in an ultraviolet light tower above the liquid photopolymer that has been spread on polymer holder to a depth greater than 0.6 centimeter and preferably 0.8 centimeter. The ultraviolet light, for example from a mercury or zenon bulb, is turned on to expose the liquid photopolymer. The length of exposure and preexposure or bump can be utilized to control depth of the grooves or raised portions.

It is preferred to control the distance of the ultraviolet light lights positioned above the photopolymer within 12 to 60 centimeters with the preferred distances for mercury lights closer than for xenon lights. It should be appreciated that the control of this distance can be used to control the slope of the raised portions of the design to give varying angles of slope to the tread grooves.

The unexposed liquid photopolymer is removed by washing or blowing it off to leave the set polymer having the three-dimensional design of the tread or article.

The nature of this invention can be understood more readily by reference to the drawings wherein:

FIG. 1 is a design of a tire tread displayed on a CRT cathode ray tube;

FIG. 2 is partial perspective view of the exposure tower showing ultraviolet lights, transparency on holder and support for liquid photopolymer;

FIG. 3 is a perspective view showing liquid photopolymer being blown off the polymer support;

FIG. 4 is a perspective view of the sight model of the tread design as electronically displayed; and FIGS. 5 and 6 are cross-sectional views of the sight model fitted with a sight support to form a tire mold.

Referring specifically to FIG. 1, the CRT cathode tube 1 is connected to a conventional computer (not shown) and with associated softwear equipment (not shown) that is programmed to cause a tire tread design 2 to be generated and displayed on the screen 3 as a two-dimensional view. A picture of the tread design 2 as displayed is made with a suitable camera by exposing the film and then developing the exposed film to get the desired negative or positive transparency.

This transparency 4 having preferably essentially the dimension of the desired tread is placed in a transparent area of a transparency holder 5 and is locked in a fixed position thereon, preferably by means of a vacuum pulled on line 6 by manipulation of valve V in the vacuum means (not shown). The transparency holder 5 in FIG. 2 is shown positioned above the plate holder 7. The distance between the transparency holder 5 and the plate holder 7 may vary from essential contact to 0.6, and preferably 0.1 to 4 centimeters apart. Where they are essentially in contact a nonadhering film such as a polyester or polyethylene is used to keep the liquid photopolymer from contacting the transparency holder and sticking thereto.

The plate holder 7 preferably has walls 8 to retain the liquid photopolymer as a layer of uniform depth at least 0.6 centimeter and preferably 0.8 or more centimeters. Sufficient liquid photopolymer is applied to the plate holder to overfill the cavity formed by the wall 8 thereof and the liquid is drawn down with a doctor knife (not shown) to bring the liquid level with the top of walls 8.

With the transparency in position as shown by numeral 4 and liquid photopolymer level with top of walls 8 the photopolymer may be exposed to ultraviolet light from lights 9 by activation of suitable switch (not shown) connected to said lights. The length of light exposure controls penetration and cure of the photopolymer. A short exposure, viz bump, without transparency being in place or from the bottom through a transparent polymer holder is advantageous to give initial thickness before the design is introduced.

The distance between the lights, transparency and photopolymer can be varied to control the vertical shape of valleys 10 between the raised areas 11. Normally a distance of 12 to 60 centimeters between the light and photopolymer gives essentially vertically sloping valley lines 1 depending on light sources, viz xenon or mercury light.

BEST MODE FOR CARRYING OUT THE INVENTION

The nature of the invention and its many benefits can be more readily understood by exemplifying and illustrative examples, where all parts and percentages are by weight unless otherwise specified.

EXAMPLE 1

A tire tread design was generated electronically by a computer and displayed on the face of a CRT tube, photographed and a transparency of dimension of tread was made. The transparency was fixed in transparency holders by use of a vacuum to rest above a polymer holder filled with the liquid polyether urethane polymer of Examples of U.S. Pat. No. 4,057,431 which was compounded with a photoinitiator such as phenyl acetophenone. A thin sheet of polyester (Mylar—trade name) was spread over photopolymer and the distance between the transparency holder and the photopolymer was adjusted to bring them into essential contact.

The actinic lights, viz mercury bulbs, were activated and adjusted to approximately 16 centimeters above the transparency before the lights were turned on for 35 seconds. Then the polymer holders with polyester sheet removed were passed by hot air knife to blow the unexposed and unreacted liquid photopolymer into catch trough to leave a three-dimensional tire tread having raised areas 11 and large valleys or grooves and small valleys or grooves 10. Depending on the nature of the picture on the CRT display tube and exposure length the raised areas can vary from at least 0.6 centimeter to 1 to 2 centimeters above the valley floors. Also the valleys can vary in width from as little as 0.1 to 2 centimeters up to 1 or 2 more centimeters.

EXAMPLE 2

A series of tread sections were formed according to the method of Example 1 except the photopolymer was compounded with a liquid polyester plasticizer to render the cured photopolymer more flexible so tread sections 16 could be bent to fit inside mold retainer 17. Sidewall sections of the tire made in a similar manner were placed in the retainer to form a tire mold which could be used to mold a tire with a tire bladder. Thus this invention permits a tire to be molded in a very short time from a two-dimensional drawing without need or necessity to make hand carved plaster molds, etc., associated with prior art practices.

Although FIG. 5 depicts the use of sight models of an article, preferably a flexible one with a female retaining device, it should be readily appreciated that a male retaining device can be used to advantage where a number of commercial molds need to be made, as illustrated in the following example.

EXAMPLE 3

A tire master of clay in the shape of a torus was scribed out but undersized to receive a sight model of tire made as described in the above examples. With the sight model attached to the clay master 18 the wet pliable clay 19 is forced in against sight model 14 and then the cavity 23 between the sight model and the outer wall 20 to form a clay pattern of tire that can be used to make a metal casting for a commercial mold.

Negative and positive views are well-known in the photography art. Likewise in molding art there are negative and positive views. For example, the sight model of FIG. 6 is fitted on support to give the positive view but the sight model in FIG. 5 has tread shown inside tire which we have chosen to call the negative view.

Although any of the liquid photopolymerizable photopolymers and monomers can be used the polyurethane type is especially desired for ease of handling and setting. The preferred polyether urethanes and polyester urethanes are ones containing residual groups obtained by reacting hydroxyacrylic acid or hydroxymethacrylic acid or their esters, preferably of alcohol having from 1 to about 20 carbon atoms, with the preferred range being 2 to 10 carbon atoms.

It is considered an important feature of this invention that the elements of (A) generating a line drawing, optionally by electronic production and display, and (B) producing a relatively flat, practically two-dimensional, object such as a printing plate, by photopolymer technique are brought together in an inventive manner to produce a threedimensional effect such as an advantageously useful sight model.

In the description of this invention, the term "liquid photopolymer" is used to describe a material which is a liquid photopolymerizable composition.

While certain representative embodiments and details have been shown for the purpose of illustrating the invention it will be apparent to those skilled in this art that various changes and modifications may be made therein without departing from the spirit or scope of the invention.

We claim:

1. A process for preparing a three-dimensional tire tread sight model having raised areas separated by valleys; where said raised areas are raised from said valleys by at least 0.6 centimeter, and where said raised areas have a variation in height in that some raised areas are at least 0.8 centimeter higher than other raised areas said process comprising the following steps:
    (a) generating electronically a line drawing of said model and electronically displaying said drawing;
    (b) photographing said drawing to form a photographic transparency;
    (c) providing a layer of liquid photopolymer;
    (c-1) initially providing a short actinic light exposure to said photopolymer to provide an initial thickness of said photopolymer
    (d) positioning said transparency over the layer of photopolymer and exposing said photopolymer through said transparency to a variable actinic light to set the exposed portion of the photopolymer to a height of at least 0.8 centimeter higher than other levels of the set photopolymer; and
    (e) removing the liquid from the set photopolymer to form a three-dimensional model having the appearance of said drawing.

2. The process of claim 1 wherein the drawing is generated electronically and displayed electronically in either a positive or negative view.

* * * * *